United States Patent [19]

Burroughes et al.

[11] Patent Number: 5,701,016

[45] Date of Patent: Dec. 23, 1997

[54] SEMICONDUCTOR DEVICE AND METHOD FOR ITS MANUFACTURE

[75] Inventors: Jeremy H. Burroughes; Donald D. Arnone, both of Cambridge, United Kingdom

[73] Assignee: Kabushiki Kaisha Toshiba, Kawasaki, Japan

[21] Appl. No.: 562,605

[22] Filed: Nov. 24, 1995

[30] Foreign Application Priority Data

Nov. 24, 1994 [GB] United Kingdom .............. 9423758
Oct. 25, 1995 [GB] United Kingdom .............. 9521885

[51] Int. Cl.[6] ............... H01L 29/06; H01L 31/0328; H01L 31/0336; H01L 31/072
[52] U.S. Cl. .................. 257/24; 257/25; 257/192
[58] Field of Search .................. 257/24, 25, 26, 257/27, 192

[56] References Cited

U.S. PATENT DOCUMENTS

| 4,194,935 | 3/1980 | Dingle | 257/347 |
| 4,704,622 | 11/1987 | Capasso et al. | |
| 4,996,574 | 2/1991 | Shirasaki | 257/66 |
| 5,446,293 | 8/1995 | Chu | 257/25 |

*Primary Examiner*—Stephen Meier
*Attorney, Agent, or Firm*—Oblon, Spivak, McClelland, Maier & Neustadt, P.C.

[57] ABSTRACT

A semiconductor device according to the invention is characterized by comprising a stacked structure which has a plurality of layers for providing rear barrier confinement potentials, an oblique side surface intersecting edges of the plurality of layers, at least one layer overlying the oblique side such that carriers can flow in a plane parallel to the oblique side surface, and narrowing means for causing carriers to flow over the edges of the plurality of layers, only in a direction of the oblique side surface.

20 Claims, 7 Drawing Sheets

SEMICONDUCTOR DEVICE AND METHOD FOR ITS MANUFACTURE

BACKGROUND OF THE INVENTION

1. Field of the Invention

The present invention relates to a semiconductor device and a method for its manufacture. It particularly relates to a so-called quantum-effect semiconductor device.

2. Description of the Related Art

It is well known that quantum-effect devices can be made by arranging layers of semiconductor layers of different bandgaps, such that it is possible to induce a quantum well adjacent to an interface. Carriers can be confined in the well layer so that the current flowing in the well layer, between source and drain regions can be modulated by means of a control potential applied to any overlying gate electrode. The carriers, usually of high mobility, may exist in two dimensions to behave as a "two-dimensional electron gas" (2DEG) or they may be influenced by means of applied electrode potentials to exist substantially in only one dimension, i.e., as a "one-dimensional electron gas" (1DEG) otherwise sometimes referred to as a "Quantum wire."

Of course, the majority carriers can be electrons or holes so equivalent devices utilizing a two-dimensional hole gas (2DHG) or one-dimensional hole gas (1DHG) can also be realized. However, for simplicity, the generic terms 2DEG or 1DEG will be used herein and should be understood as encompassing both possibilities, unless specifically indicated to the contrary.

As an extrapolation of such confinement, it is possible to arrange barrier potentials in three dimensions to confine a puddle of 100 or so electrons. This puddle is commonly referred to as a "quantum dot" or "quantum box." In this structure, electron motion is confined in all three dimensions. However, in the context of the present invention, these terms also cover the situations where the particle wavefunction is spatially small relative to the linear dimensions of the confinement volume, so that the structure does not exhibit true quantum behavior at the operating temperature.

This kind of quantum dot confinement has conventionally been realized by placing four or more depleting Schottky gates, e.g., in a turnstile arrangement on the surface of a semiconductor heterostructure which itself contains a 2DEG. The gates squeeze the electron gas such that the remaining two degrees of freedom are impaired. This additional squeezing or confinement produces tunneling barriers around the dot through which electrons must pass if they are to enter or exit the dot. Such transport through the dot is then affected by applying an external current or voltage to the dot. This external bias raises the energy of electrons, allowing them to pass over and/or tunnel through the tunneling barriers.

Single electron charging, commonly referred to as Coulomb Blockade, manifests itself in the current-voltage characteristics of quantum dots when the confinement length is sufficiently small (=<300 nm) and the number of electrons is sufficiently small (several hundred or less). The signal electron charging energy, the Coulomb energy, is the energy penalty incurred by having to add a whole electron to the dot when electrostatics require only a fractional amount of charge to produce neutrality between the dot and the surrounding reservoir of electrons. This charging energy is about $e^2/2C$, where C is the capacitance of the dot.

A consequence of this charging energy is that if one measures conductance or resistance through the dot as a function of voltage applied across the dot, one should see "oscillations" in the conductance/resistance with a period of e/C. Alternatively, one can measure conductance/resistance as function of the confinement width and see similar oscillations. Oscillations arise in the latter case because the capacitance changes with confinement width, and therefore so does the charging energy $e^2/2C$ necessary for an electron to enter/exit the dot. For dots created by means of depleting Schottky gates, the confinement width is varied via the voltage Vfg applied to these gates. Thus one expects to see oscillations in conductance/resistance as a function of gate bias Vfg.

SUMMARY OF THE INVENTION

In principle, a device which utilizes Coulomb Blockade offers a wide range of possible applications, for example, ultra-miniature transistors and memory devices. However, the known structures utilizing Schottky gates in a turnstile configuration have been found to work only at very low temperatures, e.g., 4K.

A new kind of Coulomb Blockade device has now been devised which works at higher temperatures and even offers the possibility of room temperature operation. Thus, a first aspect of the present invention provides a semiconductor device comprising a stacked structure comprising a plurality of layers for providing rear barrier confinement potentials, an oblique side surface intersecting edges of the plurality of layers, at least one layer overlying the oblique side surface such that carriers can flow in a plane parallel to the oblique side surface and narrowing means for causing the carriers to flow over the edges of the plurality of layers only in a direction of the oblique side surface.

Not only do devices according to the present invention permit higher temperature operation than possible hitherto, by virtue of the oblique surface of the patterned substrate, they also permit a greater degree of miniaturization. The structure itself takes up less spatial room than a totally planar system and also, external wiring can be condensed. The latter is a particularly important factor when an array of such devices is arranged on a single wafer to function as a semiconductor memory. In addition, the single electron charging aspect of the quantum dots means power consumption can be extremely low.

The narrowing means must extend in a direction inclined with respect to the edges of the plurality of layers. However, in preferred structures according to the present invention, it actually extends in a direction substantially at right angles with respect to the edges of the plurality of layers.

The "narrowing means" referred to above can take a number of different forms, depending on the structure of the device.

In some forms of device based on silicon wafers, an $SiO_2$ layer is formed over the oblique side surface and the carriers are induced beneath the side surface. They are only induced underneath a gate electrode. In this case, the narrowing means is a narrowed portion of the gate electrode overlying the edges of the plurality of layers, extending in a direction inclined thereto.

In other forms, an active layer (such as of a HEMT structure) is formed over the oblique side surface and the carriers are induced in that layer. In that case a gate electrode overlying the active layer is used to deplete-out the carriers except where desired. Then, the gate electrode has a cut-away portion corresponding in shape to the gate electrode mentioned in the preceding paragraph. This cut-away portion has a narrowed portion over the edges of the plurality of layers, extending in a direction inclined thereto. Of course, the term "cut-away" just refers to the absence of gate electrode material in a given region. In practice, it could be formed by selective etching.

Alternatively, the active layer/HEMT structure itself can be selectively etched to have a narrowed region over the edges of the plurality of layers extending in a direction inclined thereto.

The device according to the invention can be fabricated for many different forms of application, for example as a transistor. An array of such devices can be used as a miniature memory device. In a typical transistor device, electrical contacts are arranged to contact the active layer respectively on either side of the narrowing means so that a conduction channel is formed therebetween. As will become apparent from the description of the preferred embodiments hereinbelow, in use this conduction channel will be "interrupted" in the sense that underneath the narrowing means at least one puddle of electrons, e.g., a "quantum dot," can be formed, isolated by means of a three-dimensional barrier.

Although the applicants do not wish to be bound by any particular theoretical explanation, the device according to the present invention has been devised so that an electron puddle or quantum dot can be isolated by confinement barriers in three dimensions as follows.

First, the carriers are confined inside the oblique side layer or in an overlying HEMT/active layer, in two dimensions in the sense that a 2DEG is induced, preferably as close as possible to the edges of the plurality of layers. At least one double confinement barrier is then induced across the 2DEG by the plurality of layers. Then, in a third direction transverse to the edges of the plurality of layers, carriers are confined in a quantum dot because the carriers in the 2DEG are depleted except under the gate electrode, and in particular, in a narrow region under the narrowed portion of the gate electrode(s).

In some embodiments, the overlying layer is made of silicon dioxide, offering the possibility of room temperature operation. Carriers rate induced just inside the oblique side surface. Alternatively the overlying layer could be part of a HEMT structure. The term "HEMT" refers to "high electron mobility transistor." A HEMT consists of a stack of relatively high and low band gap materials, for example GaAs/AlGaAs, in which carriers from a doped layer are confined in a 2 DEG adjacent the interface between the high and low band gap materials. These structures have been investigated in detail, for example see Japanese Journal of Applied Physics, Vol. 21, No. 6, June 1992, p. L381.

Advances in molecular beam epitaxy and other techniques in semiconductor manufacture mean that devices according to the present invention are easily formed using a regrowth process. Thus, devices according to the present invention can be made by a method comprising forming the stacked structure, subjecting the stacked structure to etching to exposed the oblique side surface, forming the at least one overlying area by regrowth and forming the narrowing means over the at least one overlying layer.

When the narrowing means is a narrowed portion of a gate electrode, e.g., when the at least one overlying layer is formed of $SiO_2$, the narrowed portion can be formed by selective etching which can then be continued, first into the at least one overlying layer and then, into the oblique side surface to leave an upstanding portion below the narrowed region of the gate electrode.

After this etching process reaches the at least one overlying layer, an insulating layer such as $Si_3N_4$, can be formed over the upper wafer surface. This etching can then be continued into the oblique side surface, so that the upper part of this insulating layer and that to either side of the narrowed gate portion would be removed. Then, the exposed sides of the upstanding portion can be covered with an insulating or semi-insulating sidewall structure. If the plurality of layers are formed of doped silicon, e.g., interspersed with silicon dioxide, the sidewall structure can be formed so silicon dioxide by means of an oxidation process.

Other overlying layer structures are possible using other known heterostructure systems, for example an active layer of InGaAs overlaid with a doped AlInAs layer.

The plurality of layers is constructed to induce in the plane of the 2DEG, a pair of barriers defining a "well" therebetween. In preferred embodiments, the barrier height relative to the "well" is in the order of at least 0.3 eV.

Fortuitously, it is possible to create the plurality of layers in a silicon-based or III/V semiconductor based structures by delta-doping to form layers of alternating conductivity types. For example, where a single quantum dot is to be induced, first, second and third layers of a first conductivity type and first and second layers of a second conductivity type opposite to the first conductivity type are produced. The first layer of the second conductivity type is arranged between the first and second layers of the first conductivity type, the second layer of second conductivity type being arranged between the second and third layers of first conductivity type. In this case, the layer of second conductivity type induce the barriers and the second layer of first conductivity type corresponds to the well.

Another silicon-based system comprises a pair of silicon dioxide layers (corresponding to the barriers) with a doped silicon layer therebetween.

The same effect can be produced by making the plurality of layers wherein each layer comprises a material of alternately either a higher or lower band gap relative to that of adjacent layers.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE PREFERRED EMBODIMENTS

Figure 1:
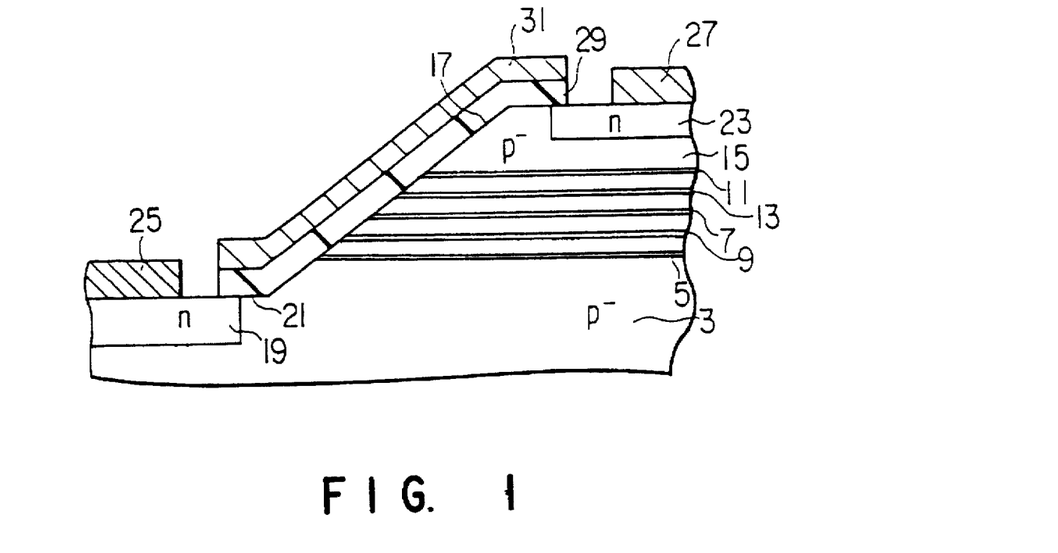
FIG. 1 shows a cross-section of a device of a first embodiment of the present invention.
Figure 2:
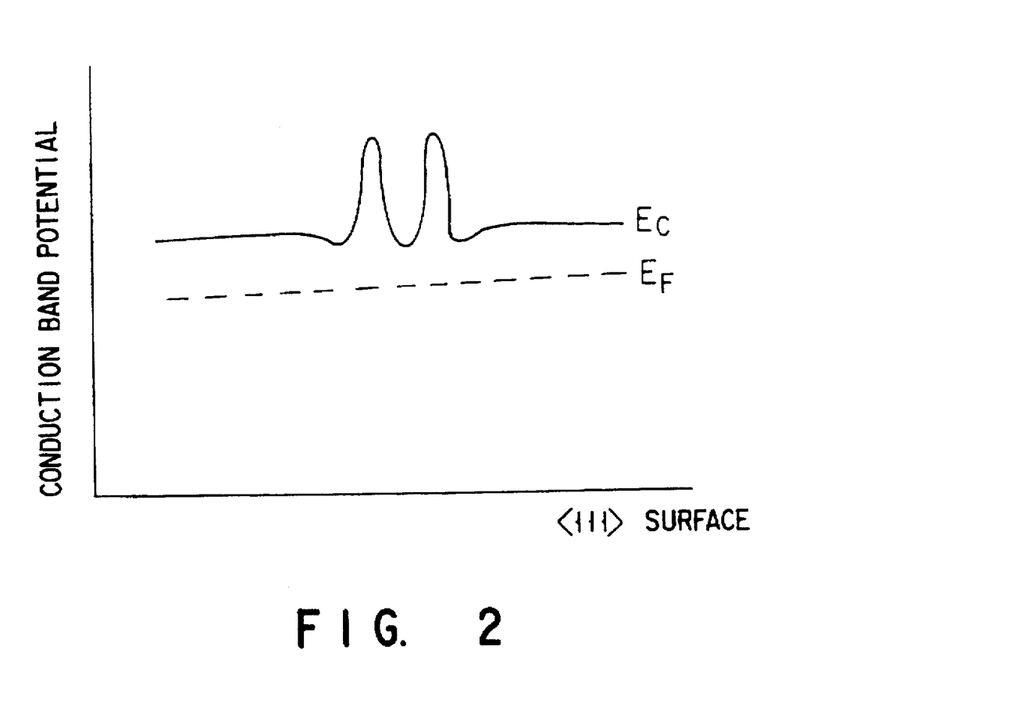
FIG. 2 shows the potential profile induced by the δp layers of the device shown in FIG. 1.

FIG. 1 shows a semiconductor device according to a first embodiment of the present invention. On a silicon p⁻substsate 3 are produced alternately delta-doped silicon layers, each with an impurity concentration in the order of $10^{13}$ cm$^{-2}$. A first δn layer 5 and a second δn layer 7 are interspersed by a first δp layer 9. The second δn layer 7 and a third δn layer 11, above the second δn layer 7, are interspersed by a second δp layer 13. The remainder of the Si wafer above the delta-doping consists of an upper p⁻layer 15. The doping concentration is chosen so that the potential profile of the conduction band ($E_c$) is modified by the δp layers as shown in FIG. 2, such that there are no free carriers in any of the d doped layers. i.e., the doping concentration and position are chosen so that the collection of doped layers are depleted leaving only the ionized impurities. In this diagram, $E_F$ represents the Fermi level. The spacing between the δn layer 9, 13 is about 100 to 400 Å. The wafer is patterned to produce an oblique facet 17 (the <111> facet at 56° to the plane of the wafer).

A first n-implant 19 is produced on the lower exposed horizontal surface 21 of the etched wafer and a second n-implant 23 is produced in the unetched top of the wafer. A (source) ohmic contact 25 is formed over the lower n-implant 19. An upper (drain) ohmic contact 27 is formed over the upper n-implant 23.

By growth over the exposed <111> facet, is grown an SiO₂ active layer 29. A poly-n-Si gate electrode 31 is deposited over the SiO₂ layer.

The source 25 and drain 27 respectively contact the 2DEG formed below the facet 17 by virtue of the lower n-implant 19 and the upper n-implant 23.

Figure 3:
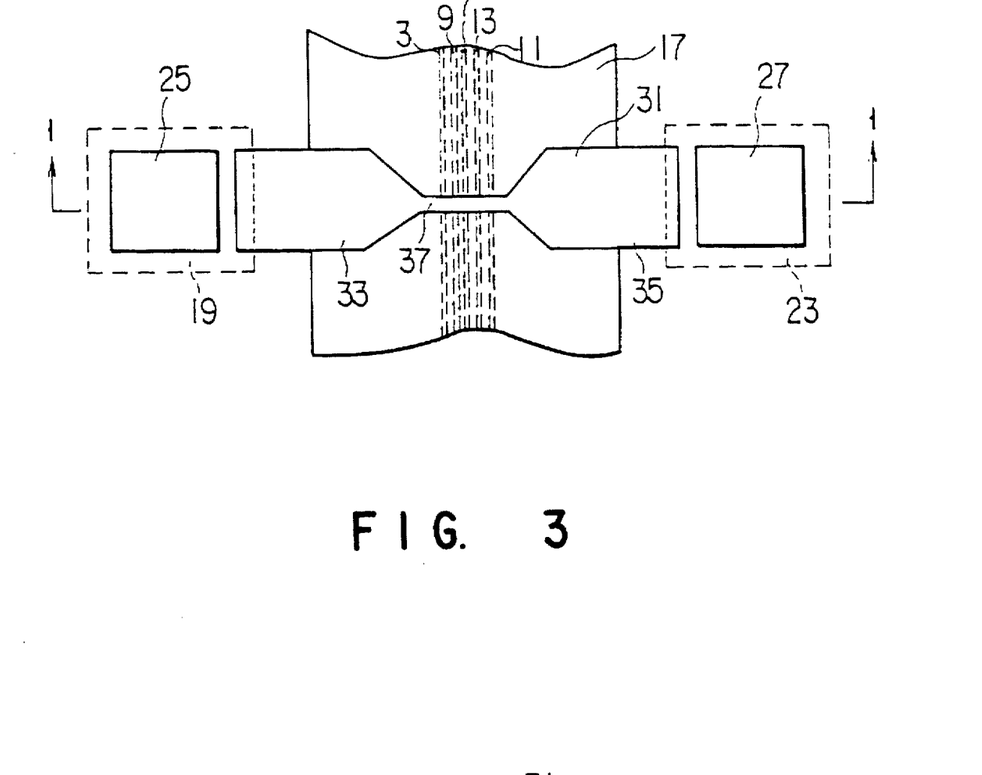
FIG. 3 shows a plane view of the device in FIG. 1 and corresponds to the plane view of devices of all subsequently described embodiments.

As can be seen from the plane view in FIG. 3, the gate electrode has a lower broad region 33 extending toward the source contact 25 and an upper broad region 35 extending towards the drain 27. The lower and upper broad regions of the gate 33, 35 are interconnected by a narrowed region 37 which overlies the edges of the delta-doped layers along the oblique facet 27, inclined substantially at right angles to the directions of the edges thereof, but is spaced apart from the delta-doped layers by the active layer 29.

In this embodiment, the gate electrode 31, and in particular, its narrowed region 37 constitutes the "narrowing means" as defined generically to delineate the scope of the present invention. In all embodiments, the narrowing means has this general shape. In those embodiments hereinbelow using silicon wafers with an SiO₂ layer, the gate electrode will be the same. In those embodiments having an active layer for confining the carriers therein, formed by regrowth, there are two possibilities for this "narrowing means."

In the first alternative, a depleting gate could be formed over the active layer/HEMT. This would have any overall shape overlying the oblique surface but with a cut-away (material absent) portion corresponding to the shape of the gate material shown in FIG. 3.

In the second alternative, the active layer/HEMT would be selectively etched to have a narrowed portion and would have the same shape as the gate electrode shown in FIG. 3. In all embodiments, the reference numeral 31 is used to refer to the gate electrode (where such exists).

Figure 4:
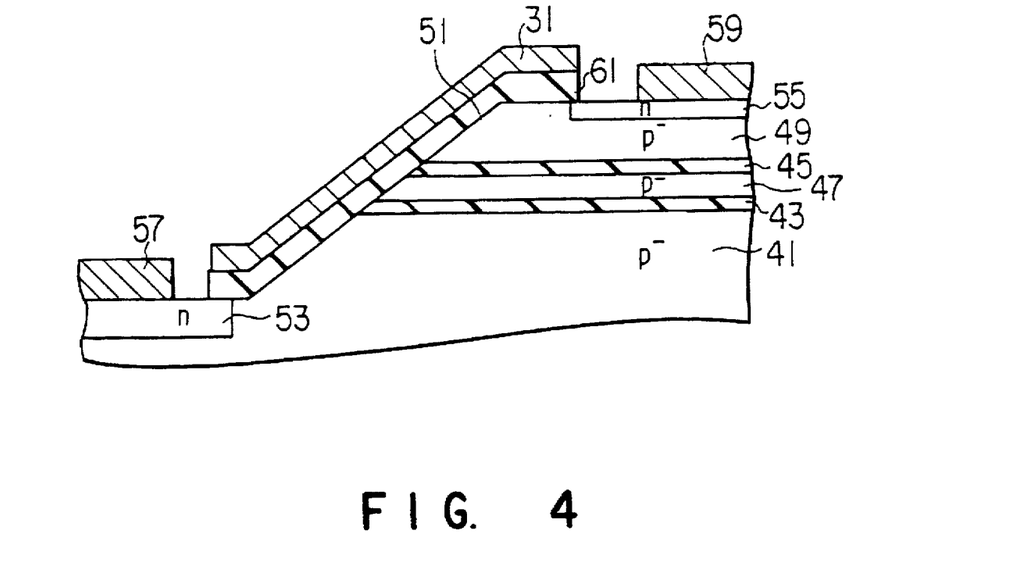
FIG. 4 shows a cross-section of a device of a second embodiment of the present invention.
Figure 5:
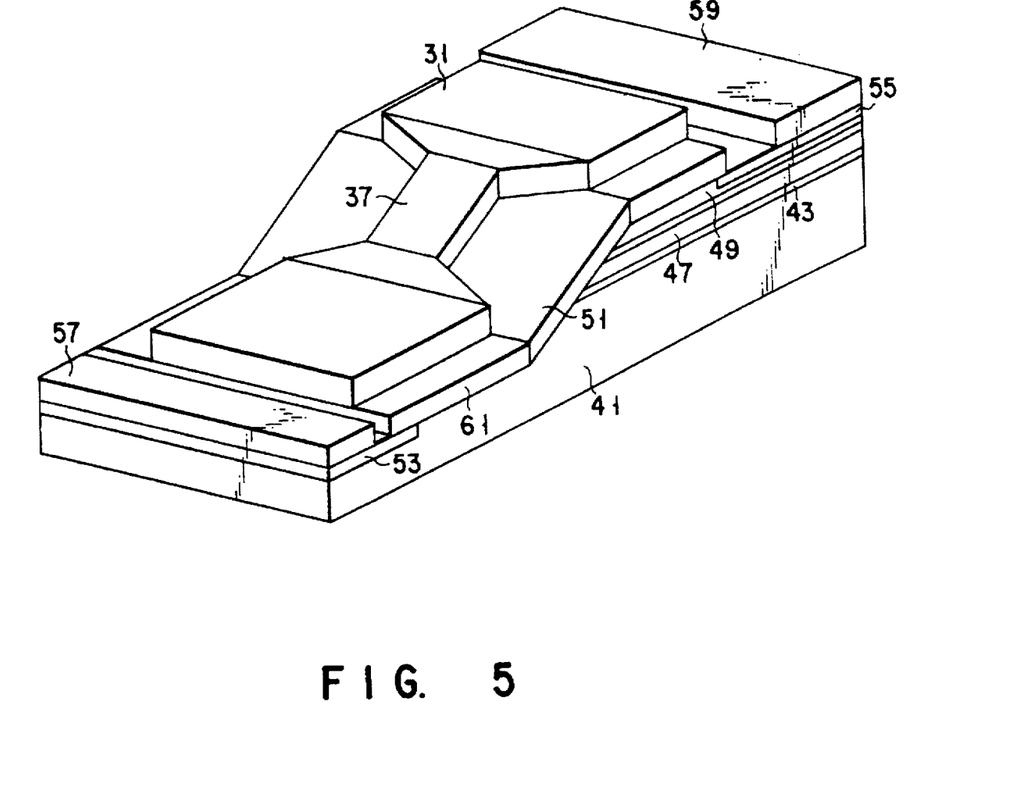
FIG. 5 shows a sectioned perspective view of the second embodiment shown in FIG. 4.

FIGS. 4 and 5 show a second embodiment of a device 39 according to the present invention, also made in silicon. It will be seen that the overall structure is generally analogous to that of the first embodiment. Integers in common with the first embodiment are denoted by the same reference numerals. Instead of the delta-doped layers, a p⁻substrate 41 has formed therein, a lower SiO₂ barrier layer 43 and an upper SiO₂ barrier layer 45, interspersed by a p⁻quantum well-inducing layer 47. The thickness of the SiO₂ barrier layers is about <20 Å and their spacing is about <1000 Å. Above this structure, the remainder of the wafer is topped with a p⁻layer 49.

The <100> vertical facet 51 is exposed by dry etching. A lower n-implant 53 and an upper n-implant 55 are formed in the same positions as the n-implants 19, 23 in the device of the first embodiment. A source ohmic contact 57 is formed contacting the lower n-plant 53 and an upper drain ohmic contact 59 contacts the upper n-implant 55.

In this embodiment, again a SiO₂ layer 61 is grown by regrowth over the inclined facet 51 (rear vertical) and the same shape of gate electrode 31 with narrowed region 37 is formed over the active layer. Again, the ohmic contacts/n-implants 53, 55, 57, 59 function as before to make contact to the 2DEG below the facet 51.

Figure 6:
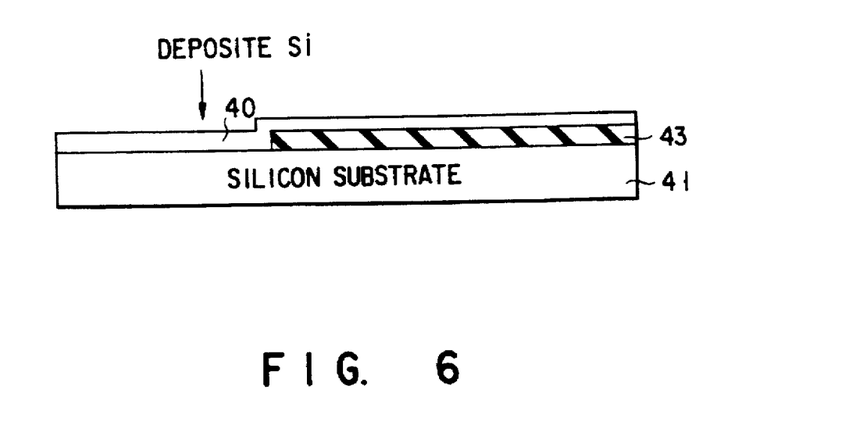
FIG. 6 shows structure for explaining the method of producing the first stage of the barrier structure of the second embodiment shown in FIGS. 4 and 5.

One preferred method for fabricating the barrier layers is a silicon re-crystallization technique. FIG. 6 shows schematic drawings for describing such a re-crystallization process. As will be explained further hereinbelow, this can be used to advantage to produce a variant of the structure shown in FIG. 5, whereby not only a narrowed gate region 37 but a narrowed conduction region defined by narrowed regions of the SiO₂ layer 51, the barrier layers 43 and 45, the well layer 47 and the p⁻Si regions 41, 49 are formed. In this way, a narrowly defined quantum box region can be produced using ULSI techniques. After the first SiO₂ barrier layer 43 is grown, it is patterned to expose the silicon substrate in a region 40 as shown in FIG. 6. An Si layer is then deposited over the whole surface. This is then heated to allow crystallization to take place. Under normal circumstance, this process would result in poly-silicon. However, the exposed silicon surface acts as a silicon crystalline seed center allowing single crystalline Si to grow over the SiO₂ layer, until interrupted by formation of a poly-silicon region 44 some distance from the SiO₂ edge. The distance between the boundary and the SiO₂ edge depends on the re-crystallization process and the thickness of the amorphous Si layer 43 is very thin (1 to 2 nm) this trend can be reverse and thin Si layers can be made to re-crystallize over about 1 μm. This is sufficient length for further processing using state of the art lithographic equipment, so under these conditions, it is an excellent process for fabricating the buried barrier layers 43, 45.

This is a technique which is not only ULSI compatible, but also will not result in a significant yield loss due to grain boundaries, etc. The critical process step is the first re-crystallization process, as this is the only Si layer that needs to be very thin. The second and last re-crystallized Si layer should be relatively thick (>200 nm) to help reduce stray capacitance.

Figure 7:
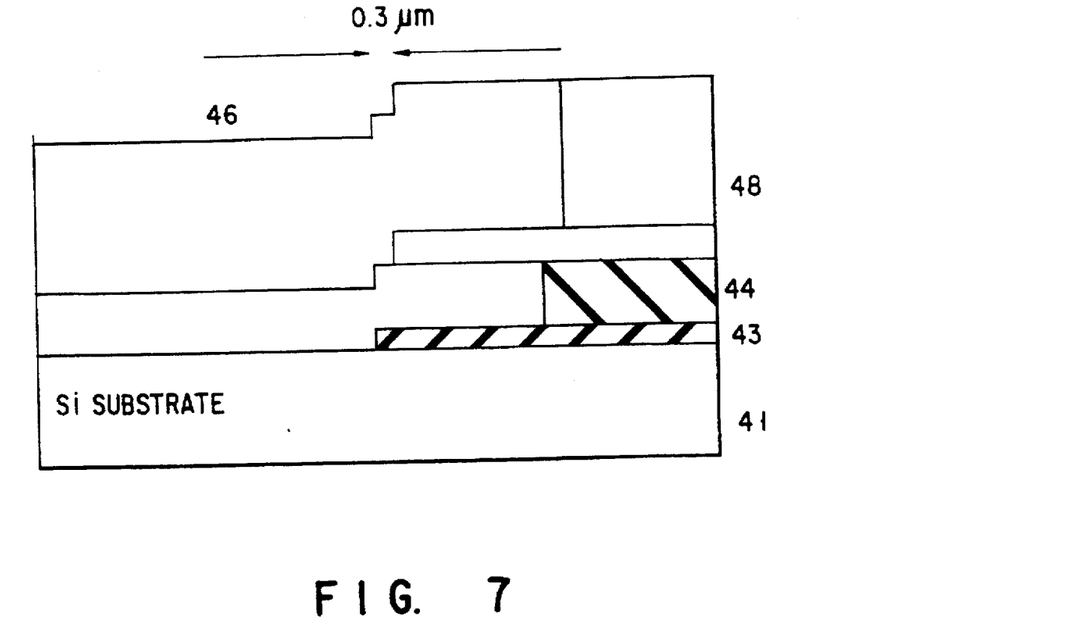
FIG. 7 shows the complete structure produced by the second stage of the barrier structure of the second embodiment shown in FIGS. 4 and 5.

FIG. 7 shows a schematic diagram to explain formation of the complete barrier layer/quantum well structure. The $SiO_2$ barrier layers 43, 45 are of different widths. This is to ensure that source/drain sweeps show steps in the conductance due to single electron tunneling. If the tunneling probability is identical for both barriers 43, 45, then in theory, no structures will be observed in source/drain sweeps. However, resonances would still be observed in the source/drain conductance as a function of gate bias.

After formation of the upper barrier layer 45, it will be appreciated that the process is repeated with deposition of a second Si layer 46 with re-crystallization to leave a second polysilicon region 48 at the edge, above the first polysilicon region 44.

Despite the progress in growing thin oxide for MOS ULSI sub-micron gate technology, the oxide thickness required for such devices means that the uniformity could reduce the dielectric breakdown strength due to pin holes over relatively large areas. Other properties such as dielectric constant and composition are also potentially difficult to control. However, as the active area of the final device is designed to be less than $10^{-11}$ $cm^{-2}$, the device design can tolerate a very high pin-hole density and still achieve high yields. For example, for just a 99% yield for the barrier oxide layers the defect density only needs to be less than $10^9$ $cm^{-2}$.

The sequence of steps for fabricating the complete structure of FIG. 4 from the basic barrier layer/quantum well structure of FIG. 7 will now be described with reference to FIGS. 8A to 8D. A technique will be outlined whereby a narrowly defined gate region and conduction channel can be fabricated overlying the well-inducing layer 47. Another method for fabricating the buried $SiO_2$ layers is by a double band and etchback process.

Figure 9:
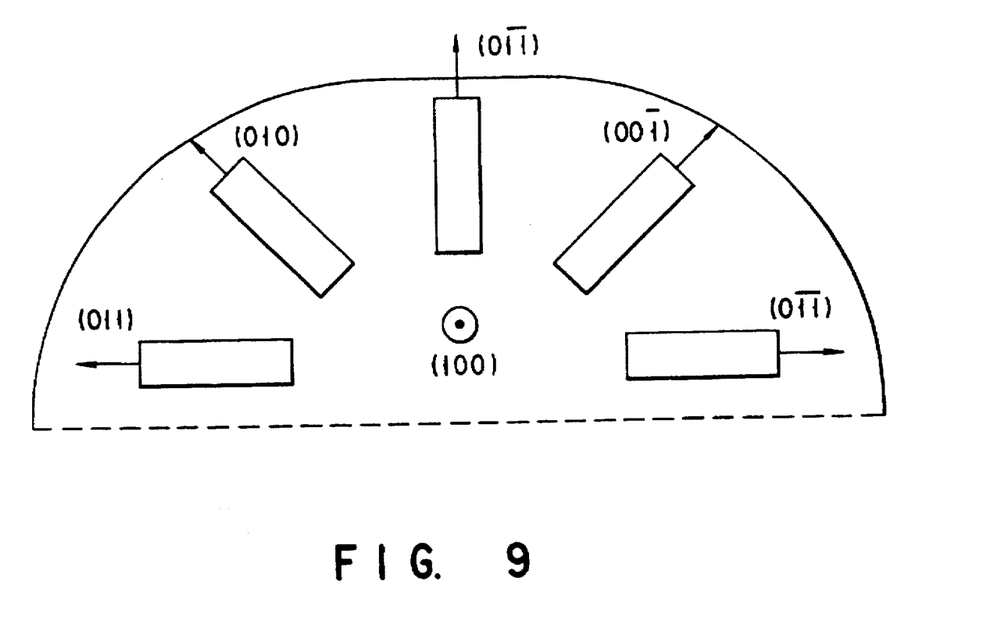
FIG. 9 shows various resultant sidewall crystallographic planes produced by etching a (100) wafer prior to formation of the structure described with reference to FIGS. 8A to 8D.

First, the $SiO_2$ layer 61 is thermally grown to 100 nm thickness. The oxide thickness variation between the facet and the (100) planes will depend on the oxide growth process and the orientation of the facet with respect to the (110) planes. FIG. 9 shows the various resultant sidewall crystallographic planes formed by etching at 90° to the wafer surface for a (100) wafer. If the mesa direction is 45 degrees to the (011) direction then the sidewall planes are all (100) like planes. Thus the oxide growth rate should be approximately the same on the sidewalls and the (100) substrate surface. If the mesa facet is oriented at 45° to the (011) plane then the facet will be one of the (001) planes, and therefore the oxide growth rate show be uniform. From a processing point of view this is the optimal orientation as all oxides to be grown will be grown on (100) like planes.

Next, a poly-n-Si layer 50 is deposited, annealed and covered with an $Si_3N_4$ layer 52. This $Si_3N_4$ layer 52 acts as a dry etch mask to protect the poly-Si 50 for subsequent Si etches described below. Then, the main gate structure is defined by etching, to form narrow 100 nm constrictions in the facet region. The narrowed region 50 of poly-n-Si represents the constricted region 37 of the gate electrode 31. The regions where the source drain contacts will be defined, are left unpatterned.

Figures 8A, 8B, 8C, 8D:
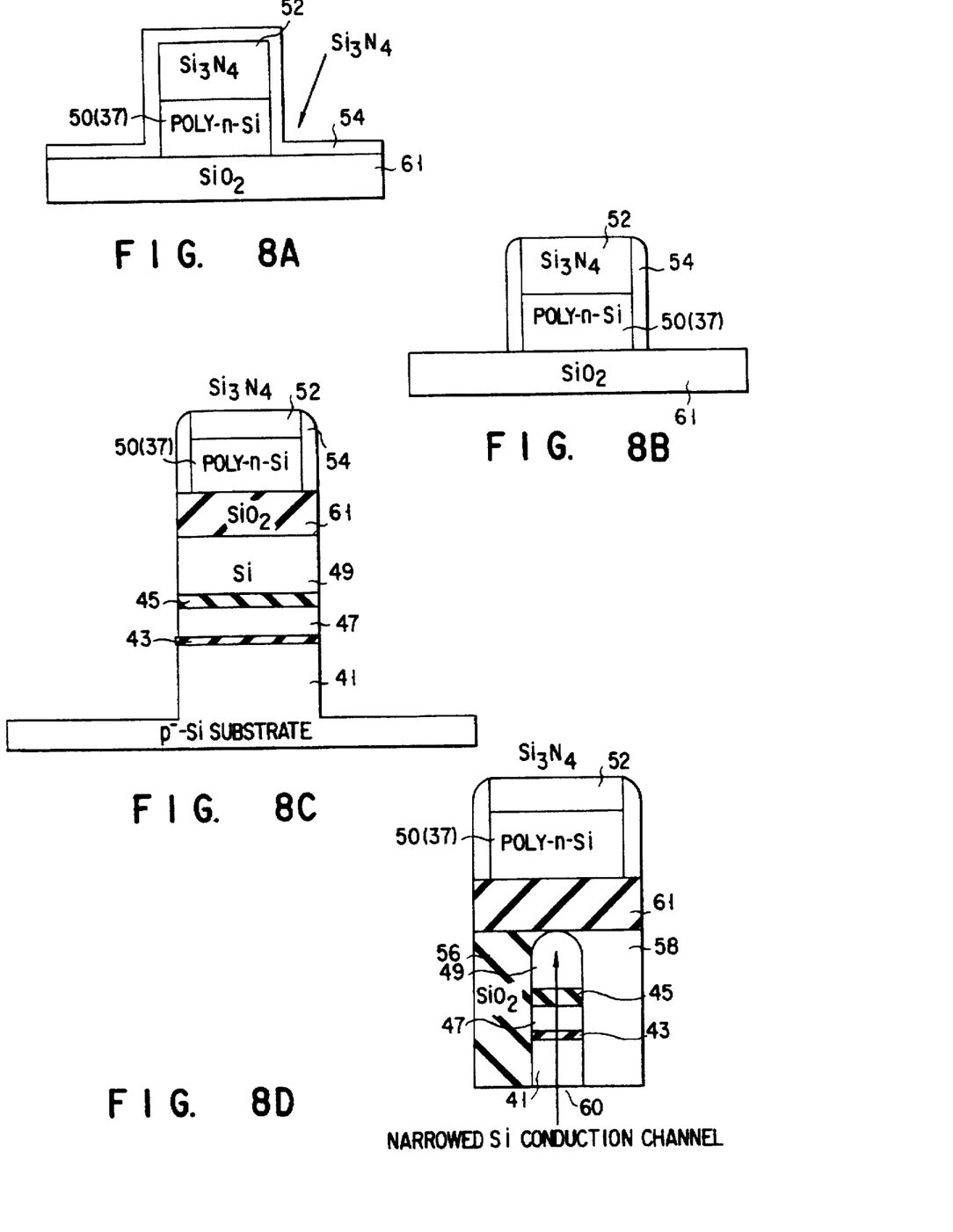
FIGS. 8A to 8D show the steps for producing a modification of the second embodiment of FIGS. 4 and 5, whereby a narrower conduction channel is formed.

A further $Si_3N_4$ layer 54 is then deposited over the whole wafer surface (FIG. 8A). This results in the poly-n-Si sidewalls being passivated by the nitride layer 54. Thus subsequent oxidation of the substrate does not result in significant oxidation of the remnant poly-n-Si 50. The thickness of the second nitride layer 54 is minimized, as this technique results in an increased line-width for the etched silicon in the next step. However, sufficient nitride is required so that the effective oxidation rate of the poly-n-Si is less than (100) $p^-$-Si. Provided that the initial nitride layer (layer 52) is thicker than the oxide layer, the oxide to nitride selectivity when the oxide layer is etched can be as low as 1. The planar regions of the $Si_3N_4$ layer 54 directly contacting the $SiO_2$ layer 61 and layer 52 are etched using a anisotropic dry etch (FIG. 8B).

Etching is continued through the re-crystallized Si layers 42, 46 and the thin $SiO_2$ barrier layers 43, 45 to a total depth of >=400 nm. This leaves the gated region standing proud of the substrate—as shown in FIG. 8C.

$SiO_2$ is then grown on the exposed sidewalls 56, 58 (FIG. 8D). Due to the exposed (001) sidewalls exposed in previous etching step, the oxide will grow under the first thermal oxide region 61 and thus in the narrow gate region to leave a constricted conduction channel 60.

Figure 10:
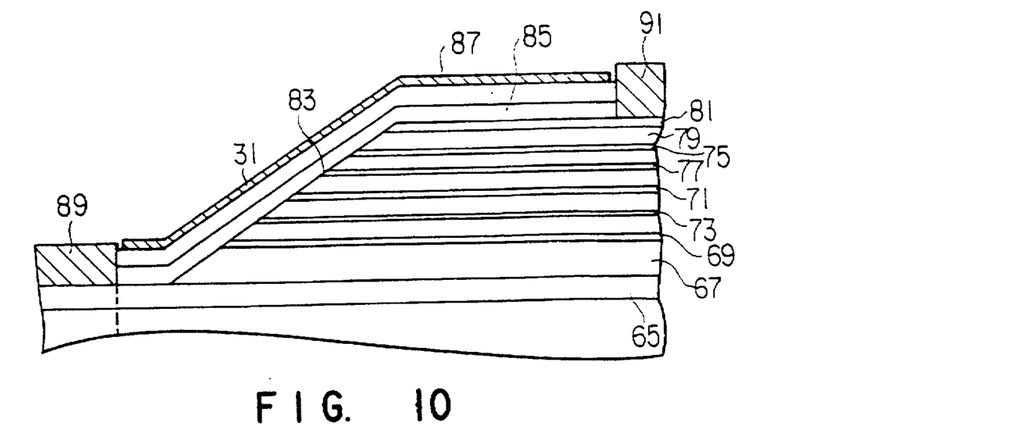
FIG. 10 shows a device of a third embodiment of the present invention.

A third embodiment of a device 63 according to the present invention is shown in FIG. 10. A lower $n^+$GaAs layer 65 of 1000 Å thickness is covered by a semi-insulating (SI) GaAs layer of 5000 Å thickness 67. Delta-doping is used to produce alternate δn and δp GaAs layers exactly as in the embodiment of FIG. 1. A lower δn layer 69 and a middle δn layer 71 are interspersed by a first δp layer 73. The middle δn layer and an upper δn layer 75 are interspersed by a second δp layer 77. The remainder of the wafer is completed by an upper SI layer of 5000 Å thickness, 79. The upper and lower δn layers are about 50 Å thickness. The spacing between the two separated δp layers is in the order of <1000 Å.

The wafer is topped by a second n+GaAs layer of 400 Å thickness, 81. Selective etching is then used to produce an inclined <311>B facet 83 intersecting the delta-doped layers.

By regrowth, over this structure is then formed a GaAs layer 85 of less than 100 Å thickness, and over that, a HEMT structure 87 having a narrow spacer layer therein. The gate electrode 31 has a cut-away region as previously described. Alternatively, the HEMT could be selectively etched to this shape. A lower ohmic contact 89 as source, and an upper ohmic contact 91 as drain, are in contact with the lower $n^+$-GaAs layer 65 and upper $n^+$-GaAs layer 81 and allow electrical contact with the 2DEG in the active layer of the HEMT.

Figure 11:
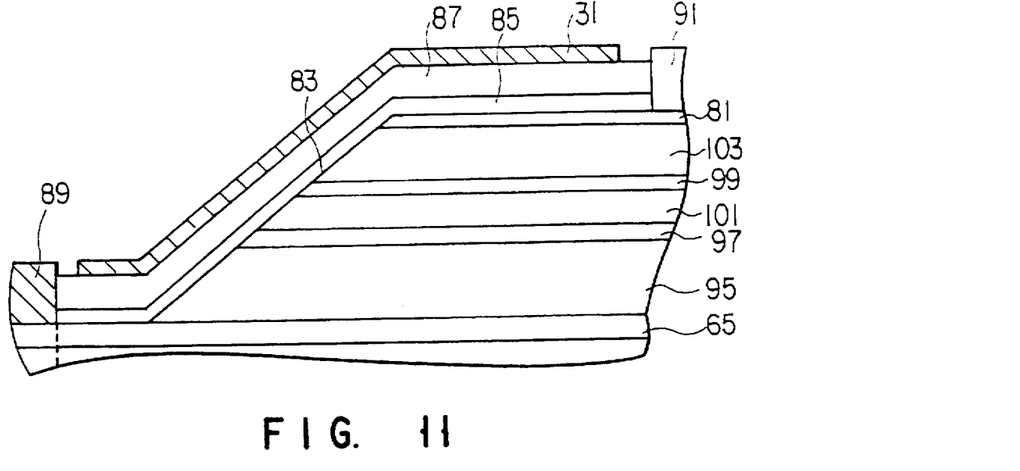
FIG. 11 shows a device of a fourth embodiment of the present invention.

A fourth embodiment of a device 93 according to the present invention is shown in FIG. 11. This embodiment is exactly the same as the embodiment of FIG. 10 and so like reference numerals are used in FIGS. 10 and 11 to denote the same integers. The only difference is that the basic wafer is GaAs with a lower GaAs layer 95 above which are arranged a lower AlGaAs layer 97 and an upper AlGaAs layer 99, interspersed by a GaAs layer 101. The top of the wafer is completed by a GaAs layer 103 and capped by the upper $n^+$-GaAs layer 81, as before and then subjected to selective etching and formation of the ohmic contacts 89, 91. In this case, the AlGaAs layers 79, 99 are used to create the pair of barriers to isolate the quantum dot.

Figure 12:
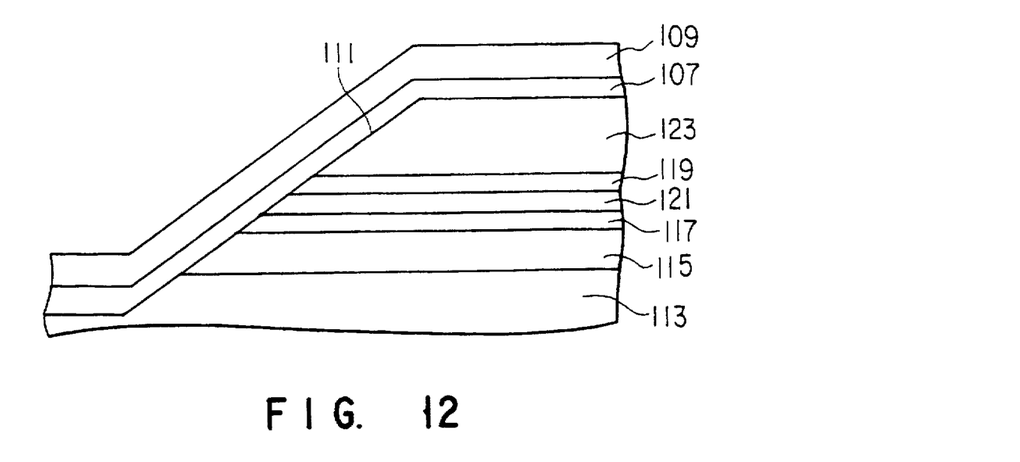
FIG. 12 shows a device of a fifth embodiment of the present invention.

Finally, a fifth embodiment of a device 105 of the present invention is shown in FIG. 12. This uses the same form of implant and ohmic contact as in the first three embodiments but for simplicity, these are not shown in FIG. 7. However, the source and drain contact an InGaAs layer 107 which is covered by an n-AlInAs layer 109. These are formed by regrowth over the selectively etched basic wafer with exposed <311>B facet.

This etched wafer has a lower n-InP layer 113. Above this is an InGaAs layer 115 of more than 1000 Å thickness. A lower InP layer 117 and an upper InP layer 119 are interspersed by an InGaAs layer 121 of about 100 to 400 Å thickness. An upper InGaAs layer ($p^-$-$In_{0.53}Ga_{0.47}As$) layer 123.

Figure 13:
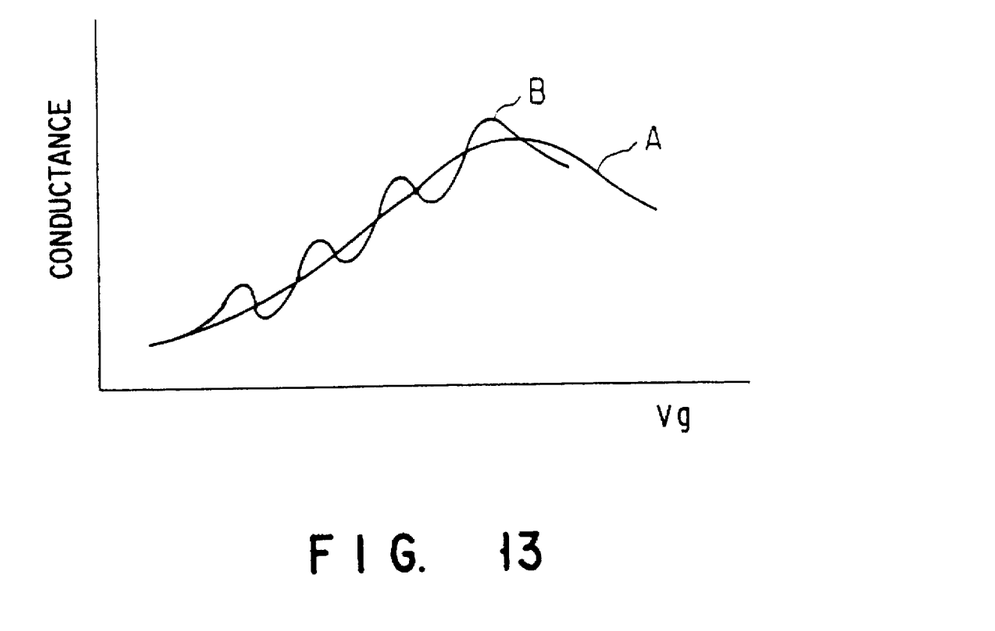
FIGS. 13 and 14 show schematic views of conductance behavior of devices according to the present invention, respectively dependent on the gate voltage and source-drain voltage.
Figure 14:
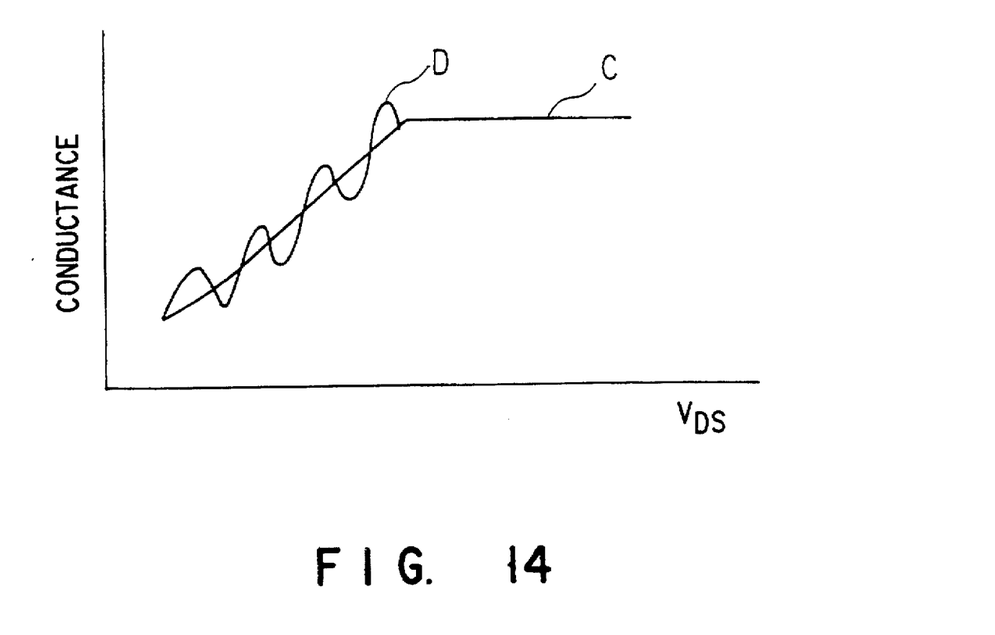

Functioning of the device can be understood by references to the graphs in FIGS. 13 and 14. Respectively, these show a conductance plot (source-to-drain) versus the gate voltage (Vg), relative to the barrier-producing pair of layers in the stacked plurality of layer structure, and source-drain voltage $V_{DS}$.

As shown in FIG. 13, the behavior of a conventional FET is shown by curve A, showing the increase in conductance with gate bias. A device according to the present invention behaves as shown by curve B and has "oscillations" or ripples, therein, representing a transition of a single electron into, and out of the quantum dot.

In FIG. 14, the source-drain response shows, for curve C, convention FET behavior of increased conductance until saturation. Again, a device according to the present invention (curve D) follows the same general shape but instead of the roughly linear build-up, there are oscillations or ripples representing transition of an electron across the quantum dot.

It will be appreciated that more layers can be put into the basic etched wafer to produce a plurality of pairs of barriers and hence, more quantum dots. In that case, the elongate region of the gate electrode has to be extended to cover each. In that case, it is possible to pass an electron from one dot to another in sequential fashion, rather analogous to operation of a charge-coupled device (CCD) or shift register.

It will also be appreciated that the presence or absence of an electron within a quantum dot, as evidenced by the conductance change as shown in FIG. 13 or 14, can be utilized so that the device acts as a memory cell. Thus, a low-consumption, ultra-miniature memory device can be realized by an array of such devices, produced by single wafer processing. The advantages of such a structure are as outlined in the introduction to the specification.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising;.
   a stacked structure formed on a top surface of a substrate to form a mesa and having a plurality of layers wherein the mesa defines an oblique side surface oblique with respect to the top surface of the substrate and thereby intersecting edges of said plurality of layers, said edges thereby presenting an edge direction where intersected,
   at least one layer overlying the oblique side such that carriers can flow in a plane parallel to the oblique side surface, said plurality of layers providing rear barrier confinement potentials for isolating regions of said carriers, and
   narrowing means extending parallel to the oblique side surface and having a reduced dimension in the center part thereof measured in the transverse direction of the oblique side surface for narrowing said regions of carriers to form respective quantum dots, thereby causing carriers to flow over the edges of the plurality of layers, only in a direction which is inclined with respect to the said edge direction.

2. A device according to claim 1, wherein the narrowing means extends in a direction substantially at right angles with respect to the edges of the plurality of layers.

3. A device according to claim 1, further comprising first and second contacts electrically contacting the carriers respectively on either side of the narrowing means.

4. A device according to claim 1, further comprising a gate electrode having a predetermined width and wherein the narrowing means comprises a portion of the gate electrode which portion is narrower that said predetermined width.

5. A device according to claim 4, wherein the at least one overlying layer comprises a layer made of silicon dioxide.

6. A device according to claim 4, wherein the plurality of layers comprises a doped quantum well-inducing layer, and, first and second doped layers, each separated from said doped quantum-well inducing layer by a respective insulating barrier layer.

7. A device according to claim 4, wherein the overlying layer is narrowed beneath the narrowed portion of the gate electrode.

8. A device according to claim 4, wherein the quantum well-inducing layer is narrowed beneath the narrowed portion of the gate electrode.

9. A device according to claim 8, wherein the first and second doped layers are narrowed beneath the narrowed portion of the gate electrode.

10. A device according to claim 8, wherein the quantum well-inducing layer and the first and second doped layers are situated between insulating or semi-insulating sidewalls upstanding from the oblique side surface.

11. A device according to claim 10, wherein the sidewalls are composed of silicon dioxide.

12. A device according to claim 4, wherein the plurality of layers comprises delta-doped layers of alternating conductivity types.

13. A device according to claim 12, wherein the delta-doped layers comprise first, second and third layers of a first conductivity type and first and second layers of a second conductivity type opposite to said first conductivity type, the first layer of second conductivity type being arranged between the first and second layers of first conductivity type and the second layer of second conductivity type being arranged between the second and third layers of first conductivity type.

14. A device according to claim 12, wherein the plurality of layers comprise delta-doped silicon.

15. A device according to claim 4, wherein the plurality of layers comprise two silicon dioxide layers interspersed with a doped silicon layer.

16. A device according to claim 4, wherein the plurality of layers comprise layers of material each of alternating higher and lower band gap relative to an adjacent layer.

17. A device according to claim 1, further comprising a gate electrode having a predetermined width and wherein the narrowing means comprises a cut-away portion of the gate electrode which portion is narrower that said predetermined width.

18. A device according to claim 1, further comprising an active layer which constitutes the overlying layer and wherein the narrowing means is a narrowed portion of the active layer.

19. A device according to claim 1, wherein the at least one overlying layer comprises a high electron mobility transistor structure.

20. A device according to claim 1, wherein the at least one overlying layer comprises an active layer made of InGaAs overlaid with a doped AlInAs layer.

* * * * *